(12) United States Patent
Lee

(10) Patent No.: US 9,543,459 B2
(45) Date of Patent: Jan. 10, 2017

(54) FLEXIBLE SOLAR CELL APPARATUS AND METHOD OF FABRICATING THE SAME

(75) Inventor: Dong Keun Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 91 days.

(21) Appl. No.: 14/352,345

(22) PCT Filed: May 25, 2012

(86) PCT No.: PCT/KR2012/004189
§ 371 (c)(1),
(2), (4) Date: Jul. 1, 2014

(87) PCT Pub. No.: WO2013/058457
PCT Pub. Date: Apr. 25, 2013

(65) Prior Publication Data
US 2014/0332061 A1    Nov. 13, 2014

(30) Foreign Application Priority Data
Oct. 17, 2011    (KR) .................. 10-2011-0106118

(51) Int. Cl.
H02N 6/00        (2006.01)
H01L 31/042      (2014.01)
H01L 31/048      (2014.01)
H01L 31/0392     (2006.01)
H01L 31/046      (2014.01)

(52) U.S. Cl.
CPC ....... *H01L 31/048* (2013.01); *H01L 31/03928* (2013.01); *H01L 31/046* (2014.12); *Y02E 10/52* (2013.01); *Y02E 10/541* (2013.01)

(58) Field of Classification Search
CPC ............. H01L 31/048; H01L 31/03928; H01L 31/046; H01L 31/02366; Y02E 10/541; Y02E 10/52
USPC .......................................... 136/251
See application file for complete search history.

(56) References Cited

U.S. PATENT DOCUMENTS 7,935,884 B2 *  5/2011  Oi .................. H01L 31/048
                                                136/251
2011/0232744 A1  9/2011  Larsen et al.
(Continued)

FOREIGN PATENT DOCUMENTS

CN    201910436 U    7/2011
CN    102217081 A    10/2011
(Continued)

OTHER PUBLICATIONS

International Search Report in International Application No. PCT/KR2012/004189, filed May 25, 2012.
(Continued)

*Primary Examiner* — Tamir Ayad
(74) *Attorney, Agent, or Firm* — Saliwanchik, Lloyd & Eisenschenk

(57) ABSTRACT

Disclosed are a flexible solar cell apparatus and a method of fabricating the same. The flexible solar cell apparatus includes a support substrate including an internal region and an outer region surrounding the internal region, a plurality of solar cells on the internal region, and a protective layer on the outer region and the solar cells. A top surface of each solar cell is lower than a top surface of the outer region of the support substrate.

11 Claims, 2 Drawing Sheets

(56) References Cited

U.S. PATENT DOCUMENTS

| | | | |
|---|---|---|---|
| 2012/0012163 A1* | 1/2012 | Yu | B32B 17/10036 136/251 |
| 2012/0103392 A1* | 5/2012 | Daniel | H01L 25/042 136/246 |
| 2012/0235268 A1* | 9/2012 | Niira | H01L 31/048 257/432 |

FOREIGN PATENT DOCUMENTS

| | | | | |
|---|---|---|---|---|
| JP | H06-044155 U | 6/1994 | | |
| JP | H10-317590 | 12/1998 | | |
| JP | H11-087753 A | 3/1999 | | |
| WO | WO 2010/114196 | * 10/2010 | ........... | H01L 31/042 |
| WO | WO 2011/065571 | * 6/2011 | ........... | H01L 31/052 |

OTHER PUBLICATIONS

Office Action dated Oct. 8, 2015 in Chinese Application No. 201280062483.7.

* cited by examiner

FLEXIBLE SOLAR CELL APPARATUS AND METHOD OF FABRICATING THE SAME

CROSS-REFERENCE TO RELATED APPLICATIONS

This application is the U.S. national stage application of International Patent Application No. PCT/KR2012/004189, filed May 25, 2012, which claims priority to Korean Application No. 10-2011-0106118, filed Oct. 17, 2011, the disclosures of each of which are incorporated herein by reference in their entirety.

TECHNICAL FIELD

The embodiment relates to a flexible solar cell apparatus and a method of fabricating the same.

BACKGROUND ART

Solar cells may be defined as devices to convert light energy into electric energy by using a photovoltaic effect of generating electrons when light is incident onto a P—N junction diode. The solar cell may be classified into a silicon solar cell, a compound semiconductor solar cell mainly including a group I-III-VI compound or a group III-V compound, a dye-sensitized solar cell, and an organic solar cell according to materials constituting the junction diode.

The minimum unit of the solar cell is a cell. In general, one cell generates a very small voltage of about 0.5V to about 0.6V. Therefore, a panel-shape structure of connecting a plurality of cells to each other in series on a substrate to generate voltages in a range of several voltages to several hundreds of voltages is referred to as a module, and a structure having several modules installed in a frame is referred to as a solar cell apparatus.

Typically, the solar cell apparatus has a structure of glass/filling material (ethylene vinyl acetate, EVA)/solar cell module/filling material (EVA)/surface material (back sheet).

In general, the glass includes low-iron tempered glass. The glass must represent high light transmittance and be treated to reduce the surface reflection loss of incident light.

The EVA used as the filling material is interposed between the front/rear side of the solar cell and the back sheet to protect a fragile solar cell device. When the EVA is exposed to UV light for a long time, the EVA may be discolored, and the moisture proof performance of the EVA may be degraded. Accordingly, when the module is fabricated, it is important to select a process suitable for the characteristic of the EVA sheet so that the life span of the module can be increased, and the reliability of the module can be ensured. The back sheet is placed on a rear side of the solar cell module. The back sheet must represent superior adhesive strength between layers, must be easily handled, and must protect the solar cell device from an external environment by preventing moisture from being infiltrated into the rear side of the solar cell module.

In general, a substrate used for the solar cell apparatus mainly includes a plastic substrate or a metallic substrate. However, when the above substrates are bent due to external physical force, the substrates may be cracked to cause damage to the light absorbing layer. In addition, the filling material used in the conventional solar cell apparatus may not have a thickness sufficient to absorb external shock due to the structure characteristic thereof.

DISCLOSURE OF INVENTION

Technical Problem

The embodiment provides a flexible solar cell apparatus having resistance against external shocks or damages and having an improved bending characteristic, and a method of fabricating the same.

Solution to Problem

According to the embodiment, there is provided a flexible solar cell apparatus which includes a support substrate including a central region and an outer region surrounding the central region, a plurality of solar cells on the central region, and a protective layer on the outer region and the solar cells. A top surface of each solar cell is lower than a top surface of the outer region of the support substrate.

According to the embodiment, there is provided a flexible solar cell apparatus including a support substrate including a central region having a top surface with a first concavo-convex pattern and a bottom surface with a second concavo-convex pattern corresponding to the first concavo-convex pattern, and an outer region surrounding the central region, a plurality of solar cells on the central region, and a protective layer on the outer region and the solar cells. A top surface of the solar cells is lower than a top surface of the outer region of the support substrate.

According to the embodiment, there is provided a method of fabricating a flexible solar cell apparatus. The method includes preparing a support substrate, forming central and outer regions having a height difference by patterning the support substrate, forming a plurality of solar cells on the central region, and forming a protective layer on the outer region and the solar cells.

Advantageous Effects of Invention

According to the flexible solar cell apparatus of the embodiment, the solar cells are placed lower than the support substrate. Accordingly, the protective layer formed on the solar cells can be formed at a thick thickness, and can have improved resistance against external shocks or damages.

In addition, according to the embodiment, the bending strength of the support substrate can be improved by forming a concavo-convex pattern on the top surface of the support substrate. Therefore, the solar cell apparatus according to the embodiment can be easily applicable for a field requiring flexibility.

MODE FOR THE INVENTION

Figure 1:
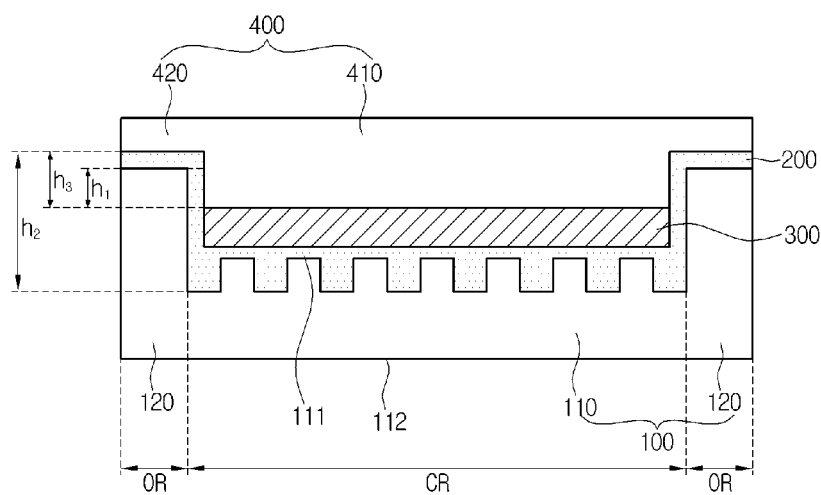
FIG. 1 is a sectional view showing a solar cell apparatus according to the embodiment.

In the description of the embodiments, it will be understood that, when a substrate, a layer, a film, or an electrode is referred to as being "on" or "under" another substrate, another layer, another film, or another electrode, it can be "directly" or "indirectly" on the other substrate, the other layer, the other film, or the other electrode, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

Figure 2:
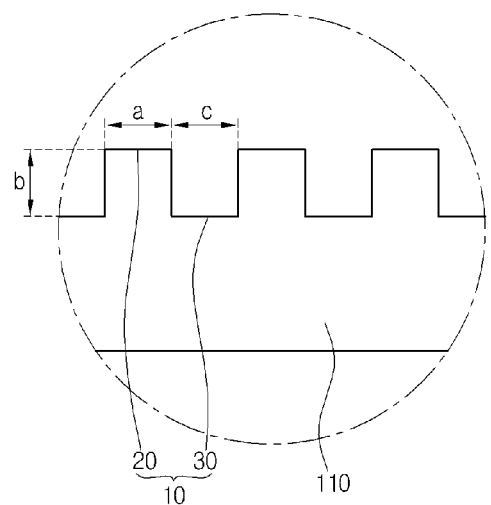
FIGS. 2 and 3 are sectional views showing a concavo-convex pattern according to the embodiment.
Figure 3:
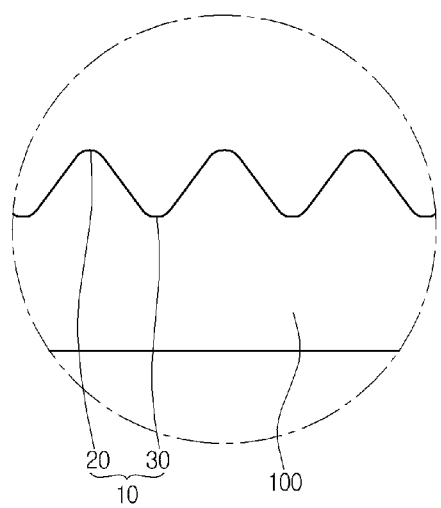
Figure 4:
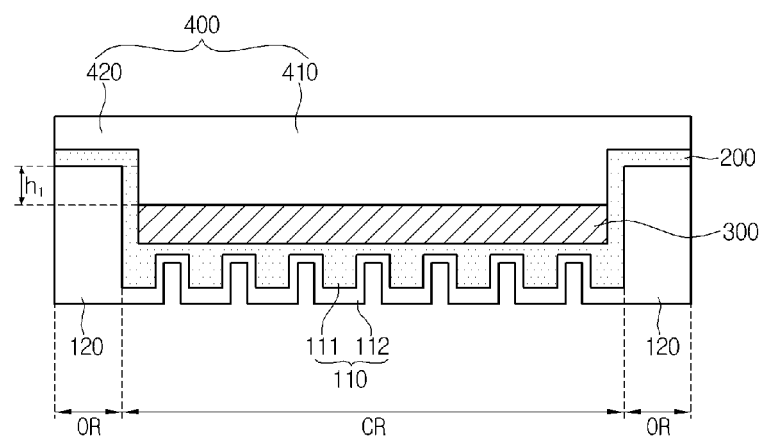
FIG. 4 is a sectional view showing a solar cell apparatus according to another embodiment.
Figure 5:
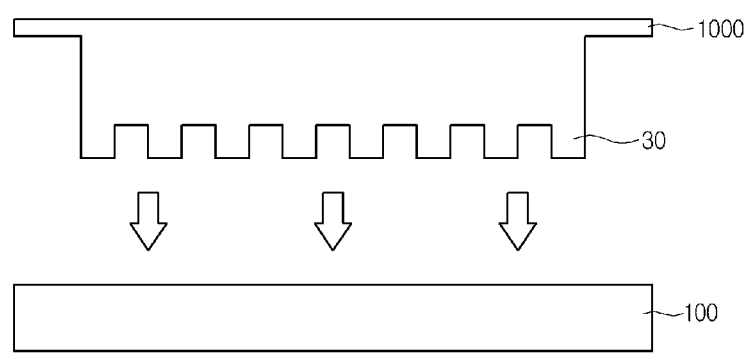
FIGS. 5 and 6 are sectional views showing a scheme of forming a first concavo-convex pattern according to the embodiment.
Figure 6:
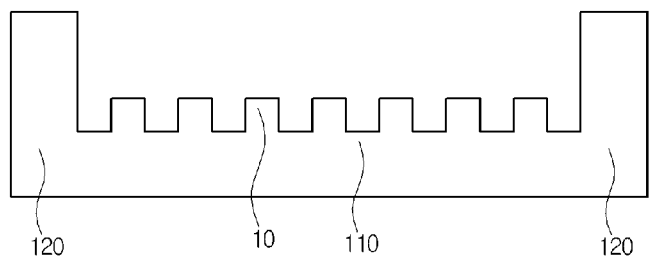

FIGS. 1 and 4 sectional views showing a flexible solar cell apparatus according to the embodiment, FIGS. 2 and 3 are sectional views showing a concavo-convex pattern according to the embodiment, and FIGS. 5 and 6 are sectional views showing a scheme of forming a first concavo-convex pattern according to the embodiment.

Referring to FIG. 1, the flexible solar cell apparatus according to the embodiment includes a support substrate 100, a barrier layer 200, a plurality of solar cells 300, and a protective layer 400.

The support substrate 100 has a plate shape, and supports the barrier layer 200, the solar cells 200, and the protective layer 400.

The support substrate 100 may include a rigid panel or a flexible panel. In more detail, the support substrate 100 may include a flexible panel.

The support substrate 100 may include a glass panel, a plastic panel, or a metallic panel. In more detail, the support substrate 100 may include a flexible plastic panel or a flexible metallic panel. For example, the support substrate 100 may include a stainless steel panel, a polyethylene terephthalate (PET) panel, or a polyimide panel, but the embodiment is not limited thereto.

Referring to FIG. 1, the support substrate 100 includes a central-region support substrate 110 and an outer-region support substrate 120 surrounding the central-region support substrate 110. In the following description, even if the central-region support substrate 110 is distinguished from the outer-region support substrate 120 for the illustrative purpose, the embodiment is not limited thereto. In other words, the central-region support substrate 110 is integrally formed with the outer-region support substrate 120.

The central-region support substrate 110 and the outer-region support substrate 120 have a height difference h2. The top surface of the outer-region support substrate 120 may be higher than the top surface of the central-region support substrate by the height difference h2. For example, the height difference h2 may be in the range of about 300 μm to about 1500 μm, but the embodiment is not limited thereto.

In other words, the support substrate 100 may have a recess structure in which a central region having the central-region support substrate 110 is formed lower than an outer region having the outer-region support substrate 110.

As described above, according to the flexible solar cell apparatus of the embodiment, the central-region support substrate 110 is formed lower than the outer-region support substrate 120, and the solar cells 300 and the protective layer 400 are sequentially provided on the central-region support substrate 110. Accordingly, the protective layer 400 formed on the solar cells 300 has a thicker thickness, so that the solar cell apparatus has improved resistance against external shocks or damages.

A first concavo-convex pattern 10 is formed on a top surface 111 of the central-region support substrate 110. The support substrate 100 having the concavo-convex pattern 10 may have a more improved bending strength as compared with a support substrate without a concavo-convex pattern.

For example, even if the support substrate 100 is bent due to external force, cracks may slightly occur. In other words, the support substrate 100 has an improved flexible characteristic by the first concavo-convex pattern 10.

The first concavo-convex pattern 10 has various shapes sufficient to improve a flexible characteristic of the support substrate 100. The sectional surface of the first concavo-convex pattern 10 may have a polygonal shape such as a triangular shape, or a quadrangular shape (see FIG. 2), a curved shape of a sinusoidal wave (see FIG. 3), or a semicircular shape, but the embodiment is not limited thereto. In addition, the first concavo-convex pattern 10 may be regularly or irregularly formed.

Referring to FIGS. 2 and 3, the first concavo-convex pattern 10 may include a groove 30 and a protrusion 20. The width, the height, and the interval of the first concavo-convex pattern 10 may be several tens nanometers to several tens micrometers, but the embodiment is not limited thereto. For example, a width a of the first concavo-convex pattern 10 may be in the range of about 0.2 μm to about 2 μm. In addition, a height b of the first concavo-convex pattern 10 may be in the range of about 0.2 μm to about 2 μm. An interval c of the first concavo-convex pattern 10 may be in the range of about 0.2 μm to about 2 μm. If the width a, the height b, and the interval c of the first concavo-convex pattern 10 are less than about 0.2 μm or greater than about 2 μm, a bending characteristic or an impact buffering function may be lowered.

Meanwhile, although the embodiment has been described in that the central-region support substrate 110 has a bottom surface 112 flat with respect to the ground surface, the embodiment is not limited thereto. In other words, the bottom surface 112 of the central-region support substrate 110 may be patterned. For example, if the central-region support substrate 110 has a thin thickness, the back surface 112 of the central-region support substrate 110 may be patterned in the process of patterning a top surface 111 of the central-region support substrate 110.

FIG. 4 is a sectional view showing a solar cell apparatus according to another embodiment. Referring to FIG. 4, the central-region support substrate 110 according to the embodiment may include the top surface 111 having the first concavo-convex pattern 10 and the bottom surface 112 having a second concavo-convex pattern corresponding to the first concavo-convex pattern. The first concavo-convex pattern may be spaced apart from the second concavo-convex pattern by a predetermined distance while being in opposition to the second concavo-convex pattern.

The central-region support substrate 110 and the outer-region support substrate 120 may be fabricated by patterning a support substrate having a flat top surface.

The support substrate 100 may be patterned through various patterning processes generally known in the art. For example, the patterning process may include a molding process employing a stamp, a dry etching process, a wet etching process, or a process employing a laser light source.

Referring to FIGS. 5 and 6, after preparing a stamp 1000 having a third concavo-convex pattern 30 corresponding to the first concavo-convex pattern 10, the stamp 1000 is brought into the contact with the support substrate 100. Thereafter, the first concavo-convex pattern 10 may be formed on the top surface 112 of the support substrate 100 by pressing the stamp 1000 with respect to the support substrate 100. According to the fabricating method of the embodiment, a UV curing process can be performed during a molding process employing the stamp 1000 or after performing the molding process, but the embodiment is not limited thereto.

The barrier layer 200 is formed on the support substrate 100. The barrier layer 200 may be interposed between the protective layer 400 and the support substrate 100. For example, the barrier layer 200 formed in an outer region OR may be interposed between the outer-region support substrate 120 and the protective layer 400. In addition, the barrier layer 200 formed in the central region OR may be formed between the central-region support substrate 110 and the solar cells 300.

The barrier layer 200 can prevent the solar cell from being oxidized due to water ($H_2O$) or oxygen ($O_2$) so that the electrical characteristics of the solar cell are not degraded. In particular, the barrier layer 200 can easily shield water ($H_2O$) or oxygen ($O_2$) from being infiltrated into the lateral side of the solar cell apparatus.

The barrier layer 200 may include an organic barrier layer, an inorganic barrier layer, or an organic/inorganic complex barrier layer. For example, the organic barrier layer may include polyxylene-based polymer. In addition, the inorganic barrier layer may include a compound selected from the group consisting of $Al_2O_3$, $MgO$, $BeO$, $SiC$, $TiO_2$, $Si_3N_4$, $SiO_2$, and the composition thereof. In more detail, the barrier layer 200 may include aluminum oxide ($Al_2O_3$) layer, but the embodiment is not limited thereto.

The solar cells 300 are provided on the barrier layer 200. The solar cells 300 convert the sunlight into electrical energy. The solar cells 300 may be connected to each other in series. In addition, the solar cells 300 may be parallel to each other in one direction. For example, the solar cell 300 may include a solar cell including a group I-III-IV semiconductor compound such as a CIGS-based solar cell, a silicon-based solar cell, or a dye-sensitized solar cell, but the embodiment is not limited thereto.

A top surface of the solar cells 300 and a top surface of the outer-region support substrate 120 have the height step h1. The top surface of the solar cells 300 may be formed lower than the top surface of the outer-region support substrate 120 by the height step h1. For example, the height step h1 may be in the range of about 100 μm to about 500 μm, but the embodiment is not limited thereto.

In other words, the support substrate 100 may have a recess structure in which the central region CR is formed lower than the outer region OR, and the solar cells 300 are formed in the recessed central region CR, so that the solar cells 300 may have a step difference with respect to the outer region OR of the support substrate 100.

The protective layer 400 is provided on the support substrate 100. In more detail, the protective layer 400 formed in the outer region OR may directly make contact with the barrier layer 200. In addition, the protective layer 400 formed in the central region CR may directly make contact with the solar cells 300 formed on the barrier layer 200.

The protective layer 400 protrudes toward the support substrate 100 in the central region CR rather than in the outer region OR. In other words, the protective layer 400 has a thicker thickness in the central region CR having the solar cells 300 than the outer region OR without the solar cells 300. Therefore, the solar cells 300 have improved resistance against external shocks or damages by the protective layer 400 having a thicker thickness.

In more detail, the protective layer 400 includes a first protective part 410 and second protective parts 420 provided at both sides of the first protective part 410. The first protective part 410 and the second protective part 420 have a height difference h3. In other words, the first protective part 410 may protrude toward the support substrate 100 more than the second protective part 420 by the height difference. For example, the height difference h3 between the first and second protective parts 410 and 420 may be in the range of about 200 μm to about 1000 μm, but the embodiment is not limited thereto.

The protective layer 400 may be transparent and flexible. The protective layer 400 may include transparent plastic. In more detail, the protective layer 400 may include ethylenevinylacetate resin.

Meanwhile, although not shown, the flexible solar cell apparatus according to the embodiment may further include a protective panel, a frame, a bus bar, a junction box, and a cable.

The protective panel is provided on the protective layer 400. The protective panel protects the solar cells 300 from external physical shock and/or foreign matters. The protective panel is transparent, for example, may include tempered glass.

The frame receives the support substrate 100 to the protective layer 400 while supporting the support substrate 100 to the protective layer 400. The frame fixes the support substrate 100 and the protective layer 400.

The bus bar makes contact with the top surface of the solar cells 300, and may be connected to a circuit board in the junction box through a wire.

The junction box may be provided on the bottom surface of the support substrate 100. The junction box may receive the circuit board on which diodes are mounted. According to a solar cell module of the embodiment, the cable extends from the junction box. The cable is connected to the bus bar through the circuit board received in the junction box. In addition, the cable is connected to another solar module.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:
1. A flexible solar cell apparatus comprising:
a support substrate including a central region and an outer region surrounding the central region;
a plurality of solar cells on the central region; and
a protective layer on the outer region and the solar cells;

wherein the central region of the support substrate has a concavo-convex pattern and the plurality of solar cells are disposed on the concavo-convex pattern;

wherein the central region of the support substrate and the outer region of the support substrate have a first height difference and a top surface of the outer region of the support substrate is higher than a top surface of the central region of the support substrate by the first height difference;

wherein a first concavo-convex pattern is formed on the top surface of the central region of the support substrate;

wherein the first concavo-convex pattern has a width in a range of 0.2 μm to 2 μm;

wherein the first concavo-convex pattern has a height in a range of 0.2 μm to 2 μm; and wherein the first concavo-convex pattern has an interval in a range of 0.2 μm to 2 μm.

2. The flexible solar cell apparatus of claim 1, wherein a second height difference between a top surface of the solar cells and the top surface of the outer region of the support substrate is in a range of 100 μm to 500 μm.

3. The flexible solar cell apparatus of claim 1, wherein the first concavo-convex pattern has a triangular shape, a quadrangular shape, or a semicircular shape.

4. The flexible solar cell apparatus of claim 1, wherein the first height difference between the central region and the outer region of the support substrate is in a range of 300 μm to 1500 μm.

5. The flexible solar cell apparatus of claim 1, further comprising a barrier layer between the protective layer and the support substrate.

6. The flexible solar cell apparatus of claim 1, wherein the protective layer comprises:
    a first protective part corresponding to the central region; and
    a second protective part corresponding to the outer region, wherein the first protective part and the second protective part have a third height difference.

7. The flexible solar cell apparatus of claim 6, wherein the third height difference between the first and second protective parts is in a range of 100 μm to 1000 μm.

8. A flexible solar cell apparatus comprising:
    a support substrate including a central region having a top surface with a first concavo-convex pattern and a bottom surface with a second concavo-convex pattern corresponding to the first concavo-convex pattern, and an outer region surrounding the central region;
    a plurality of solar cells on the central region; and
    a protective layer on the outer region and the solar cells, wherein the central region of the support substrate and the outer region of the support substrate have a first height difference and a top surface of the outer region of the support substrate is higher than a top surface of the central region of the support substrate by the first height difference;

wherein a first concavo-convex pattern is formed on the top surface of the central region of the support substrate;

wherein the first concavo-convex pattern has a width in a range of 0.2 μm to 2 μm;

wherein the first concavo-convex pattern has a height in a range of 0.2 μm to 2 μm; and wherein the first concavo-convex pattern has an interval in a range of 0.2 μm to 2 μm.

9. The flexible solar cell apparatus of claim 8, wherein a second height difference between a top surface of the solar cells and the top surface of the outer region of the support substrate is in a range of 100 μm to 500 μm.

10. The flexible solar cell apparatus of claim 8, wherein the protective layer protrudes toward the support substrate in the central region rather than in the outer region.

11. The flexible solar cell apparatus of claim 8, wherein the protective layer is transparent and flexible.

* * * * *